(12) United States Patent
Singh et al.

(10) Patent No.: US 12,414,283 B2
(45) Date of Patent: Sep. 9, 2025

(54) DEVICES AND SYSTEMS FOR FLYING BITLINE WITH JUMPER CELL

(71) Applicants: Advanced Micro Devices, Inc., Santa Clara, CA (US); ATI Technologies ULC, Markham (CA)

(72) Inventors: Sahilpreet Singh, Markham (CA); John Wuu, Fort Collins, CO (US); Kerrie Vercant Underhill, Boxborough, MA (US); Ricardo Cantu, Austin, TX (US); Russell Schreiber, Austin, TX (US)

(73) Assignees: Advanced Micro Devices, Inc., Santa Clara, CA (US); ATI Technologies ULC, Markham (CA)

( * ) Notice: Subject to any disclaimer, the term of this patent is extended or adjusted under 35 U.S.C. 154(b) by 171 days.

(21) Appl. No.: 18/341,836

(22) Filed: Jun. 27, 2023

(65) Prior Publication Data

US 2025/0176154 A1    May 29, 2025

(51) Int. Cl.
*H10B 10/00* (2023.01)
*G11C 11/419* (2006.01)

(52) U.S. Cl.
CPC ............ *H10B 10/18* (2023.02); *G11C 11/419* (2013.01)

(58) Field of Classification Search
CPC . G11C 11/412; G11C 11/419; G11C 13/0004; G11C 13/0026; G11C 13/0028; G11C 13/0035; G11C 13/0061; G11C 13/0064; G11C 13/0069; G11C 2013/0054; G11C 2013/0076; G11C 2013/0088; G11C 2213/72; G11C 13/02; G11C 11/4076; G11C 11/4096; G11C 7/1042; G11C 7/1048; G11C 7/1051; G11C 7/1066; G11C 7/1078; G11C 7/1093; G11C 7/22; G11C 7/222; G11C 8/12; G11C 11/16; H10B 10/12
USPC ......... 365/158, 171, 51, 130, 148, 163, 173, 365/225.5, 243.5
See application file for complete search history.

(56) References Cited

U.S. PATENT DOCUMENTS

2023/0420017 A1* 12/2023 Kolar .................. G11C 7/1093

* cited by examiner

*Primary Examiner* — Thong Q Le
(74) *Attorney, Agent, or Firm* — Greenberg Traurig, LLP (57) ABSTRACT

The disclosed device can include a bitcell array located on a first metal layer including a first subarray of bitcells and a second subarray of bitcells; a first write driver device coupled to the first subarray of bitcells from a first end of the first subarray; a second write driver device coupled to the second subarray of bitcells from a first end of the second subarray; a third write driver device coupled to the first subarray of bitcells from a second end of the first subarray; and a fourth write driver device coupled to the second subarray of bitcells from the second end of the second subarray. Various other devices, systems, and methods of manufacture are also disclosed.

20 Claims, 10 Drawing Sheets

DEVICES AND SYSTEMS FOR FLYING BITLINE WITH JUMPER CELL

BACKGROUND

Smaller and more powerful computing devices continue to be in demand. To fit more memory on a chip, the density of memory circuits may be increased. Increasing the density of memory circuits may, in some Static Random Access Memory (SRAM) designs, involve longer bitlines. However, longer bitlines may be more resistive, which may degrade the quality of the signal on the bitline for writing to the bitcell.

BRIEF DESCRIPTION OF THE DRAWINGS

The accompanying drawings illustrate a number of example embodiments and are a part of the specification. Together with the following description, these drawings demonstrate and explain various principles of the present disclosure.

Throughout the drawings, identical reference characters and descriptions indicate similar, but not necessarily identical, elements. While the example embodiments described herein are susceptible to various modifications and alternative forms, specific embodiments have been shown by way of example in the drawings and will be described in detail herein. However, the example embodiments described herein are not intended to be limited to the particular forms disclosed. Rather, the present disclosure covers all modifications, equivalents, and alternatives falling within the scope of the appended claims.

DETAILED DESCRIPTION OF EXAMPLE IMPLEMENTATIONS

The present disclosure is generally directed to devices and systems for flying bitlines with jumper cells. The flying bitline described herein may enable designs that improve density and write speed. In addition, the devices and systems described herein may incorporate write drivers on both ends of the flying bitline, thereby potentially further improving write speed. A "bottom" bitline may extend from one write driver to the other, as may a "top" bitline, each serving half of the bitcells. The bottom bitline may jump at the jumper cell from one metal layer (e.g., M0) to another (e.g., M2). The top bitline may do the same, but with the positions of the M0 portion and the M2 portion switched. The jumper cell design may allow jumps on both sides by using a two-step "jog" jump pattern, enabling the flying bitline with two write drivers design.

The devices and systems described herein may contribute to increased memory density, improved reliability and write-ability of bitcells, and/or improved write speed.

Figure 1:
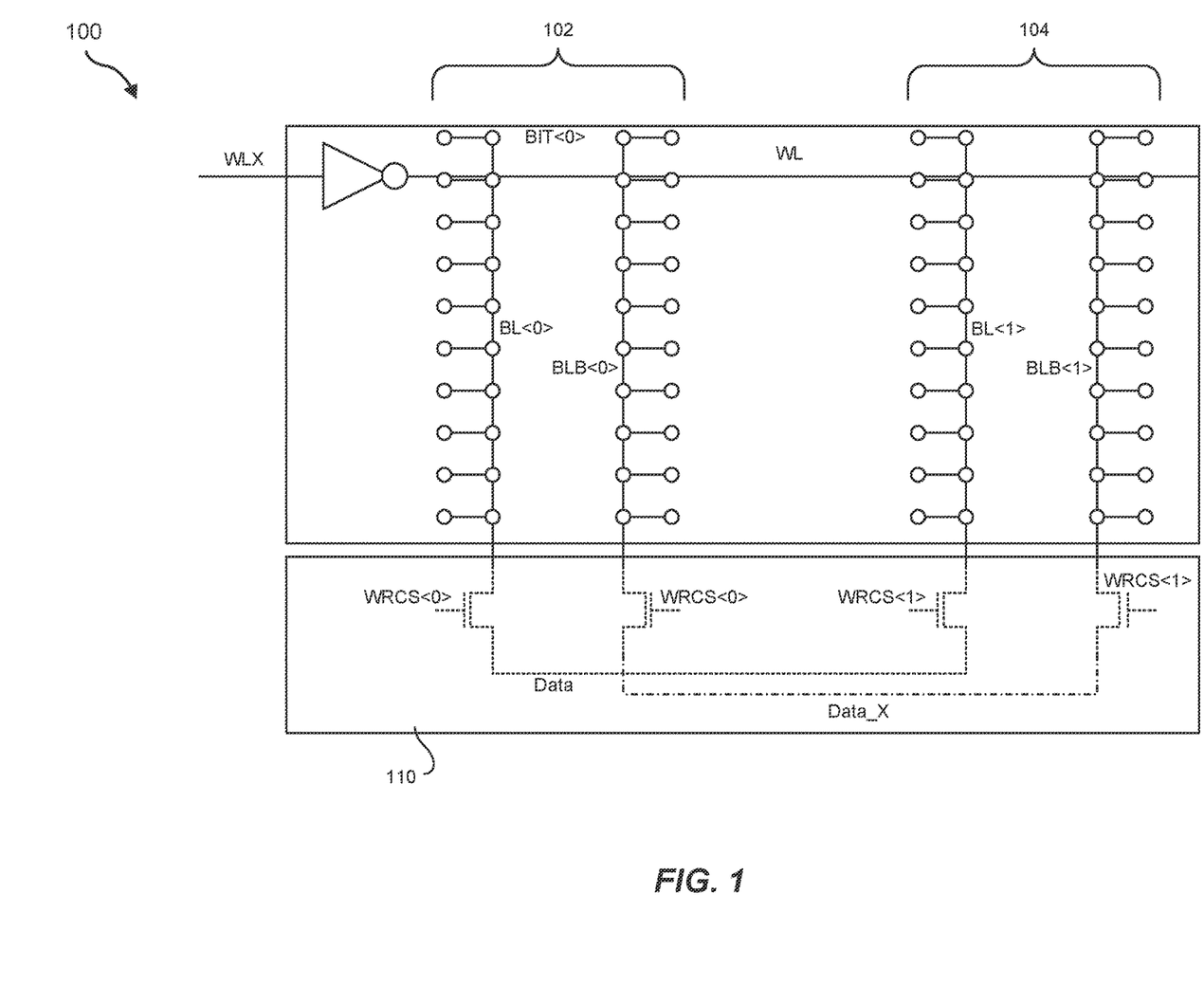
FIG. 1 is a diagram of an example bitcell array design.

FIG. 1 is a diagram of an example bitcell array device 100. In one example, bitcell array device 100 may form part of an SRAM architecture. As shown in FIG. 1, device 100 may include a bitcell array 102 and a bitcell array 104. Bitcell array 102 may include a bitline ("BL <0>") and a complementary bitline ("BLB <0>"), each of which may run the length of bitcell array 102, connecting various individual bitcells. Bitcell array 104 may similarly include a bitline BL <1> and a complementary bitline BLB <1>.

A write driver 110 may include a Metal-Oxide-Semiconductor-Field-Effect-Transistor ("MOSFET"), such as an n-channel MOSFET ("NMOS"), that connects to BL <0>, where a write control signal "WRCS <0>" connects to the gate of the MOSFET and a DATA signal connects to the source of the MOSFET. Thus, write driver 110 may amplify the DATA signal and, when WRCS <0> is active, the MOSFET may send the DATA signal to BL <0>. Similarly, an NMOS may connect to BLB <0>, also gated by WRCS <0> and sourced by a complementary DATA_X signal. Write driver 110 may perform parallel functions for bitcell array 104, with a write control signal WRCS <1> gates the flow of the DATA signal to BL <1> and gates the flow of the DATA_X signal to BLB <1>.

As used herein, the term "bitcell" may refer to any circuit that stores a bit of data. For example, the term "bitcell" may refer to a circuit that stores a single bit of data in an SRAM devices. In some examples, a bitcell may include two cross-coupled inverters and two access transistors that connect the bitcell to one or more bitlines (e.g., a bitline and a complementary bitline) and a wordline.

As used herein, the term "write driver" may refer to any circuit that is controlled by one or more write control signals to write data to selected bitcells. In some examples, a write driver may amplify an input data signal to a selected bitline to write data to a selected bitcell.

Figure 2:
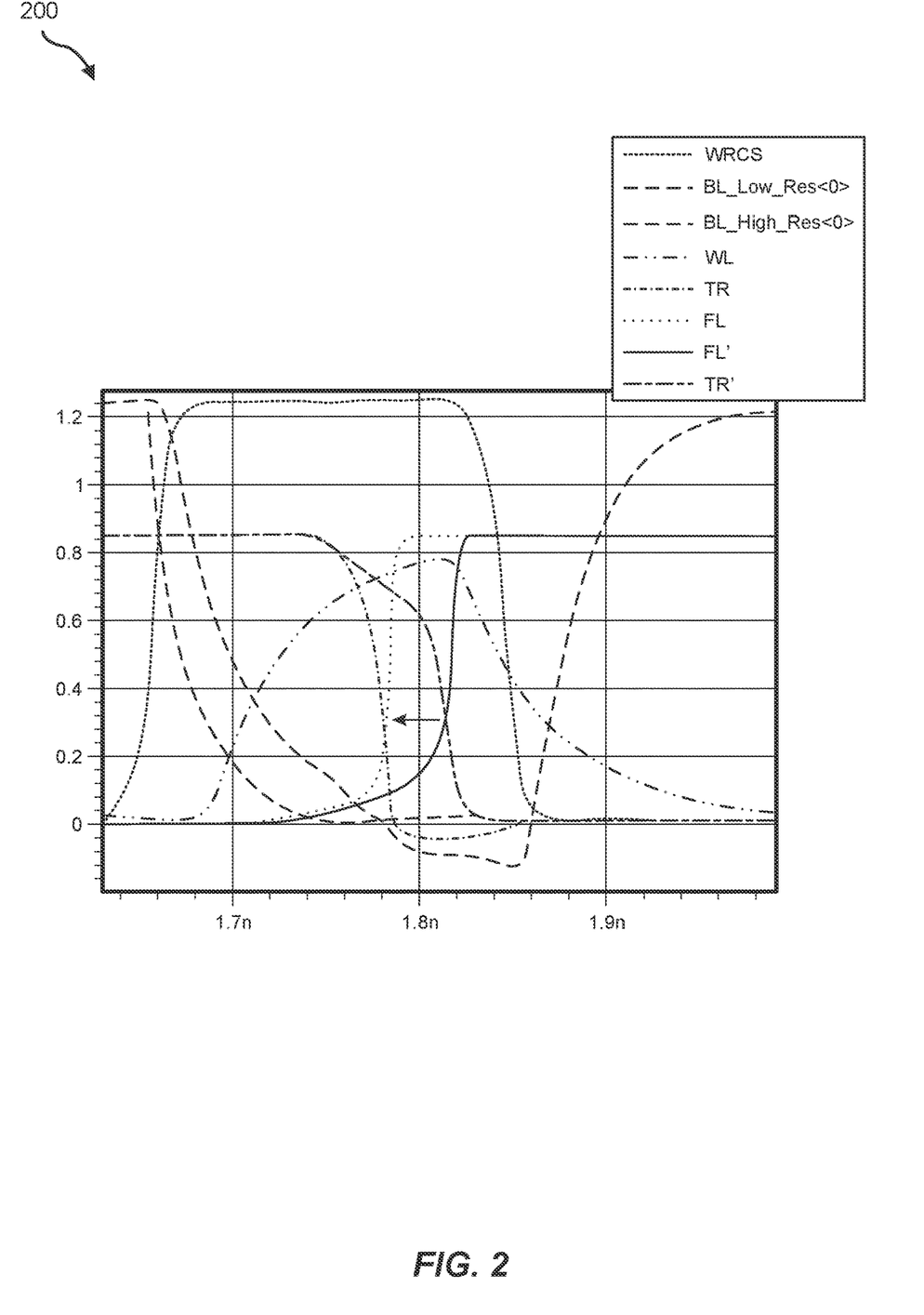
FIG. 2 is a illustration of bitcell performance under differing conditions.

FIG. 2 illustrates a graph 200 showing bitcell performance under differing conditions. Thus, for example, graph 200 shows a waveform BL_High_Res <0> showing the signal on a higher-resistance bitline and a waveform BL_Low_Res <0> showing a signal on lower-resistance bitline. WRCS shows a write control signal and WL shows a word line signal. TR shows a "true" signal of an internal node of a bitcell and FL shows a complementary signal of an internal node of a bitcell, where the bitcell is on the lower-resistance bitline. TR' and FL' show the true and complementary signals where the bitcell is on the higher-resistance bitline. As can be seen, the write time of a bitcell may be decreased by decreasing the resistance of the bitline.

Figure 3:
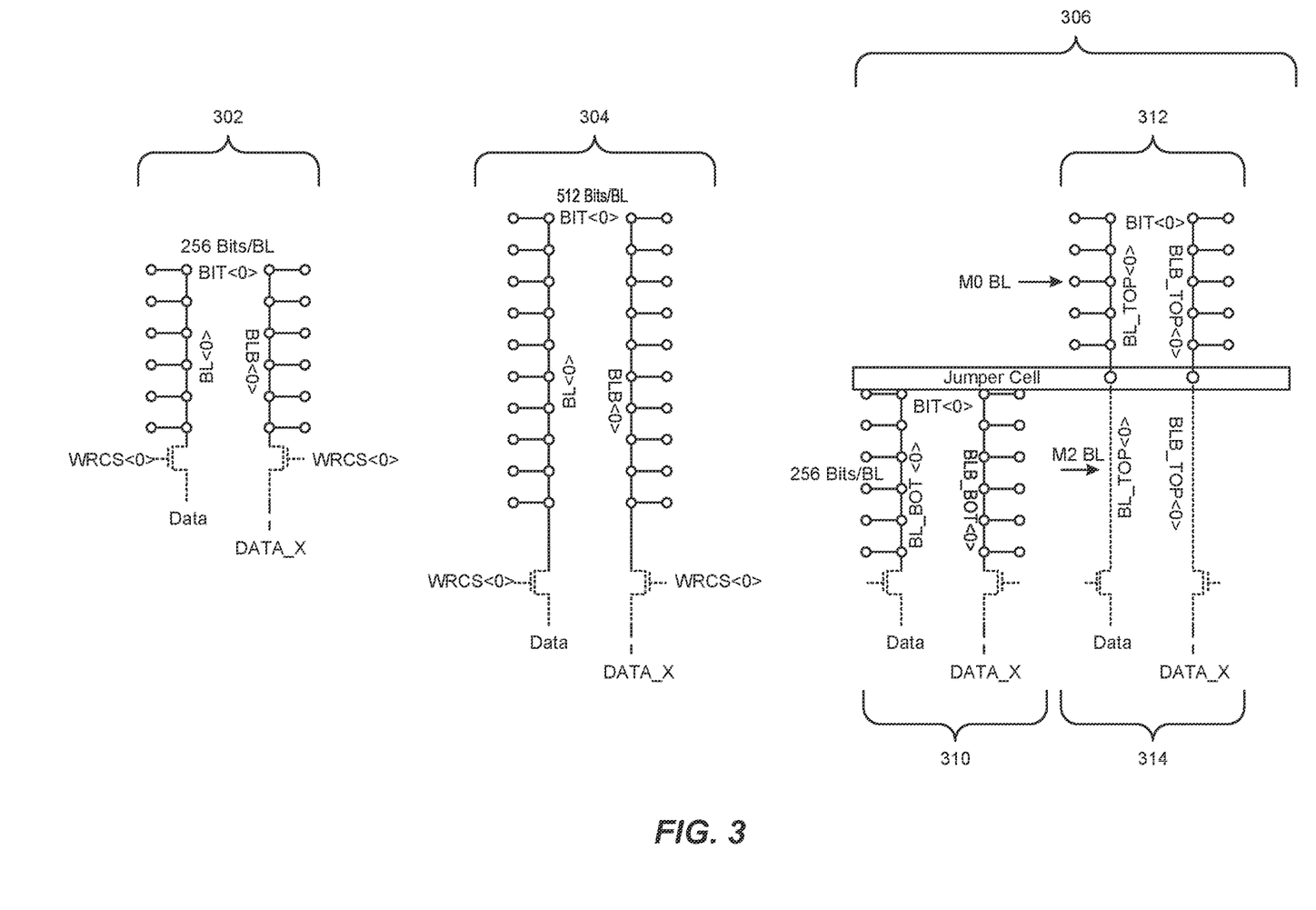
FIG. 3 is an illustration of various example bitcell array designs.

FIG. 3 is an illustration of various example bitcell array devices 302, 304, and 306. As shown in FIG. 3, bitcell array device 302 may be similar to device 100. In one example, device 302 may represent a bitcell array with 256 bits per bitline.

Bitcell array device 304 may be similar to bitcell array device 302, except bitcell array device 304 may have twice as many bitcells (e.g., 512 bits per bitline). Because the layout, structure, and proportions of device 304 may otherwise be similar to device 302, to fit 512 bits per bitline, the bitlines of device 304 may be approximately twice as long as those of device 302. The increased length of the bitlines may result in a higher bitline resistance to BIT <0> at the far end of the bitline from the write driver, potentially resulting in slower write times.

Bitcell array device 306 may divide a bitcell array into bitcell subarrays 310 and 312. Although depicted side-by-side for illustrative purposes, bitcell subarray 312 may be in line with bitcell subarray 310. In one example, bitcell subarrays 310 and 312 may both run on the M0 metal layer. A separate bitline 314 on the M2 metal layer (e.g., running underneath bitcell subarray 310) may connect bitcell subarray 312 to the write driver.

Bitcell subarray 310 may have a similar structure, layout, and speed to device 302. Bitcell subarray 312 may be slower than bitcell subarray 310. Thus, device 306 may be more dense than but slower than device 302, and less dense but faster than device 304.

Figure 4:
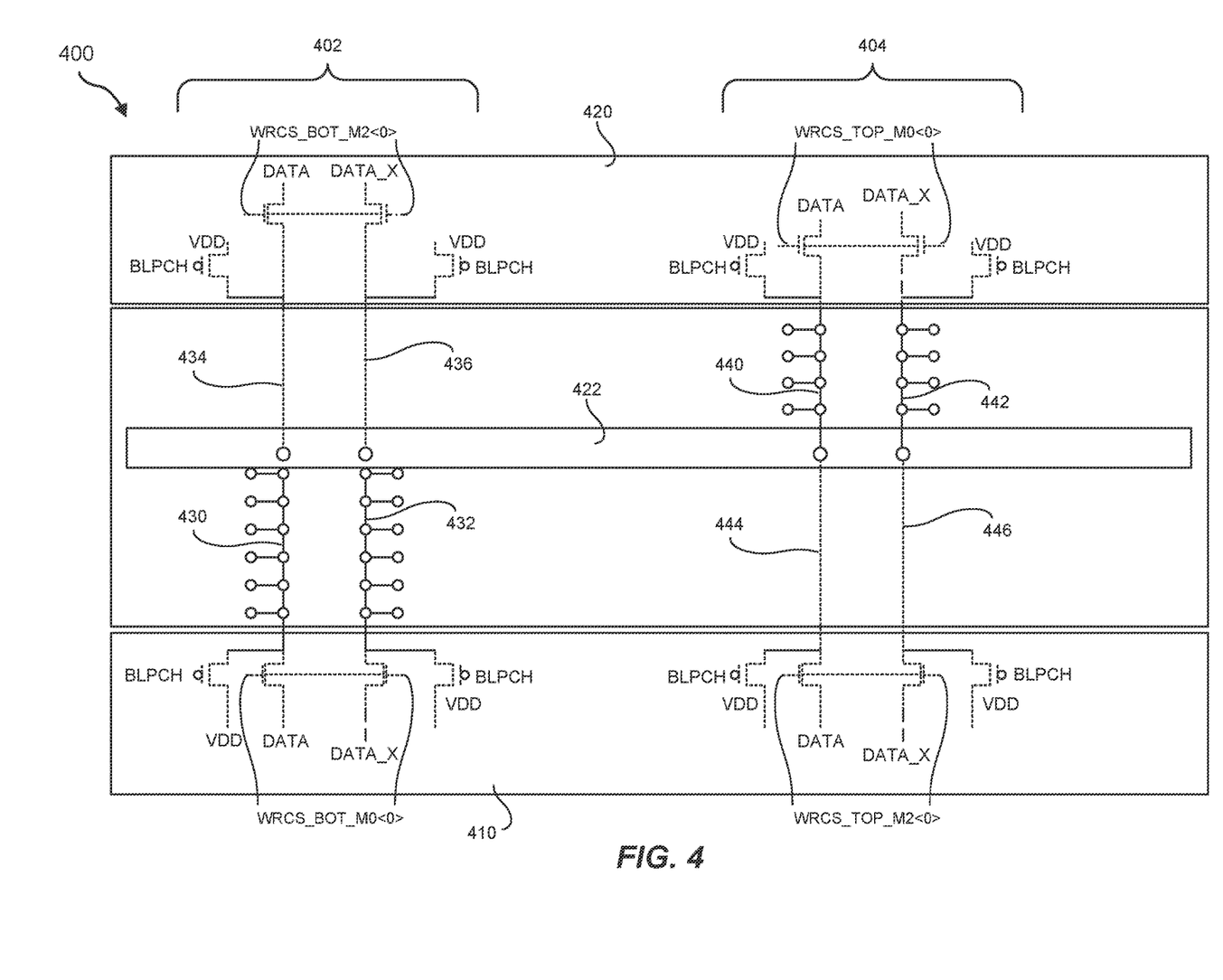
FIG. 4 is an illustration of an example flying bitline with jumper cell design.

FIG. 4 is an illustration of an example flying bitline with jumper cell device 400. As shown in FIG. 4, device 400 may include a bitcell subarray 402 and a bitcell subarray 404, whose proximate ends meet at a jumper cell 422 and whose distal ends reach write driver 410 and write driver 420. Thus, device 400 may include a write driver 410 on one end of bitcell subarray 402 and bitcell subarray 404 and a write driver 420 on the other end of bitcell subarray 402 and bitcell subarray 404.

As used herein, the term "bitcell subarray" may generally refer to a portion of a bitcell array. In some examples, the term "bitcell subarray" may refer to a portion of a bitcell array that is at least partially separate from another portion of the bitcell array. For example, two bitcell subarrays in the same array may be separated by a jumper cell. Additionally or alternatively, two such bitcell subarrays may not be regulated by the same write driver components and/or signals (e.g., the same MOSFETs, the same write control signals, etc.). Nevertheless, in various examples two such bitcell subarrays may be regarded as part of the same bitcell array. For example, two such bitcell arrays may be in a single line (e.g., with a slight interruption at a jumper cell), and, thus, may be laid out in a similar fashion to a single bitcell array. Additionally, or alternatively, the bitcells of two such bitcell arrays may be addressed as part of a single bitcell array.

While the foregoing discussion focuses on the "true" bitlines 430, 434, 440, and 444, it can be appreciated that parallel considerations apply to the corresponding complementary bitlines 432, 436, 442, and 446. In some examples, a bitline 430 (or "first bitline") may run along bitcell subarray 402. Bitline 430 may connect to a write driver 410. A write control signal WRCS_BOT_M0<0> may gate the flow of a DATA signal at a MOSFET to bitline 430. In addition, in some examples, a bitline precharge device may precharge bitline 430 in response to a BLPCH signal.

In addition, bitline 430 may be extended by bitline 434 to write driver 420. Bitlines 430 and 434 may run on different metal levels. For example, bitline 430 may run on M0 and bitline 434 may run on M2. While sometimes described herein separately (including, e.g., being referred to as "first" and "third" bitlines), bitlines 430 and 434 may be understood as a single bitline, albeit running on different metal levels. For example, bitlines 430 and 434 may connect via jumper cell 422. Because the bitline composed of bitlines 430 and 434 may be sent a DATA signal (and, in some examples, precharged) from both sides of bitcell subarray 402 (e.g., from write driver 410 and write driver 420), write operations on bitcell subarray 402 may be performed more quickly and/or reliably.

In a similar fashion, a bitline 440 (or "second bitline") may run along bitcell subarray 404. Bitline 440 may connect to write driver 420. A write control signal WRCS_TOP_M0<0> may gate the flow of a DATA signal at a MOSFET to bitline 440. In addition, in some examples, a bitline precharge device may precharge bitline 440 in response to a BLPCH signal.

In addition, bitline 440 may be extended by bitline 444 to write driver 410. Bitlines 440 and 444 may run on different metal levels. For example, bitline 440 may run on M0 and bitline 444 may run on M2. While sometimes described herein separately (including, e.g., being referred to as "second" and "fourth" bitlines), bitlines 440 and 444 may be understood as a single bitline, albeit running on different metal levels. For example, bitlines 440 and 444 may connect via jumper cell 422. Because the bitline composed of bitlines 440 and 444 may be sent a DATA signal (and, in some examples, precharged) from both sides of bitcell subarray 404 (e.g., from write driver 410 and write driver 420), write operations on bitcell subarray 404 may be performed more quickly and/or reliably.

While depicted side-by-side for easier visualization, bitcell subarray 402 and bitcell subarray 404 may be located such that they run along the same line (e.g., being substantially aligned). For example, bitline 430 may run over bitline 444 (being substantially vertically aligned with each other), and bitline 440 may run over bitline 434 (being substantially vertically aligned with each other).

Figure 5:
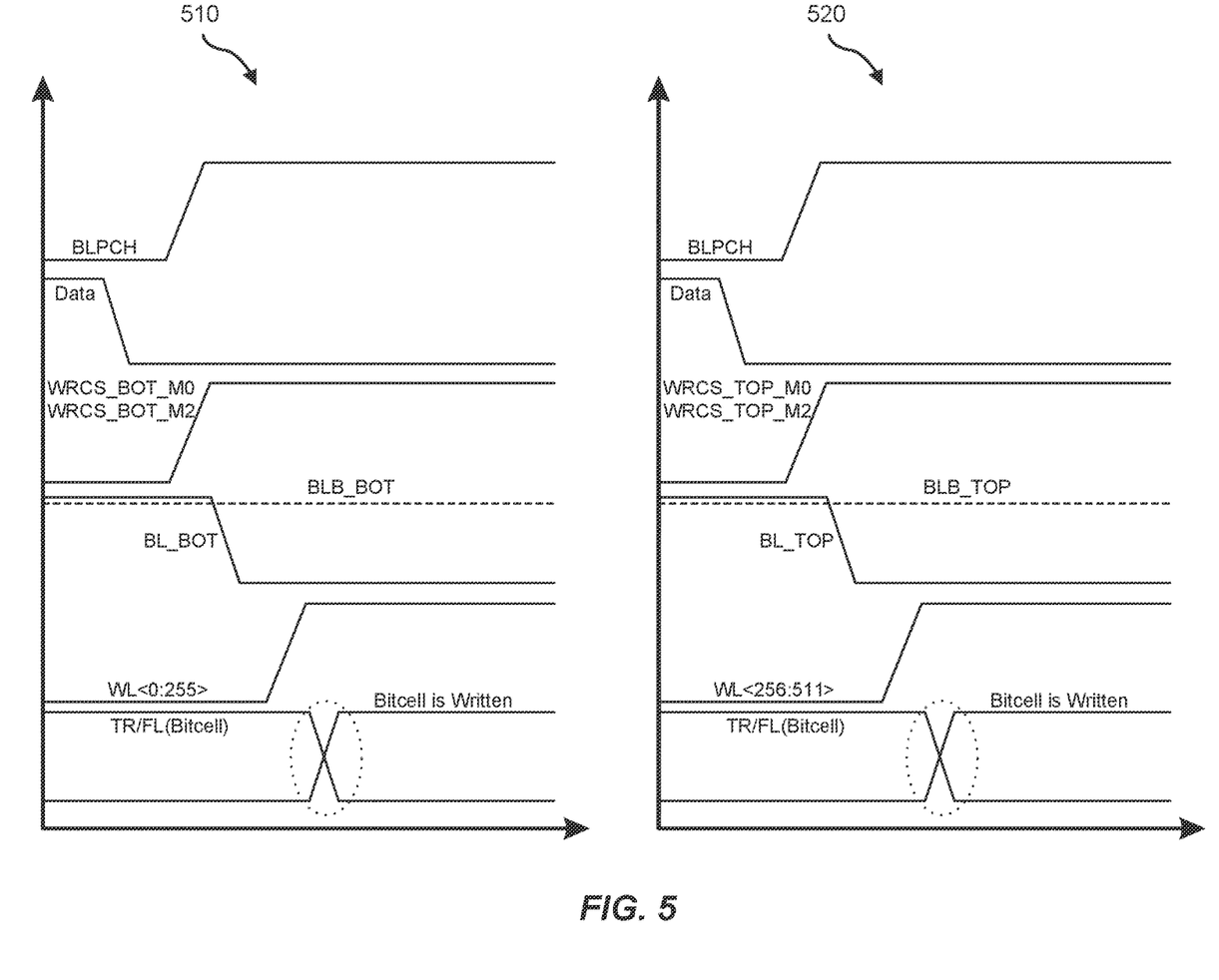
FIG. 5 is a timing diagram of an example flying bitline with jumper cell.

FIG. 5 shows timing diagrams 510 and 520 of an example flying bitline with jumper cell (e.g., the device 400 shown in FIG. 4). As shown in timing diagrams 510 and 520, a data signal may activate. A bitline precharge signal may activate, and write control signals from both sides of each composite bitline (e.g., WRCS_BOT_M0 and WRCS_BOT_M2 for the composite bitline of one subarray, and WRCS_TOP_M0 and WRCS_TOP_M2 for the composite bitline of the other subarray) may activate. The corresponding bitline signal for the corresponding composite bitline (BL_BOT/BL_TOP) may then activate. The WL signal may turn on, and then the bitcell may be written.

Figure 6:
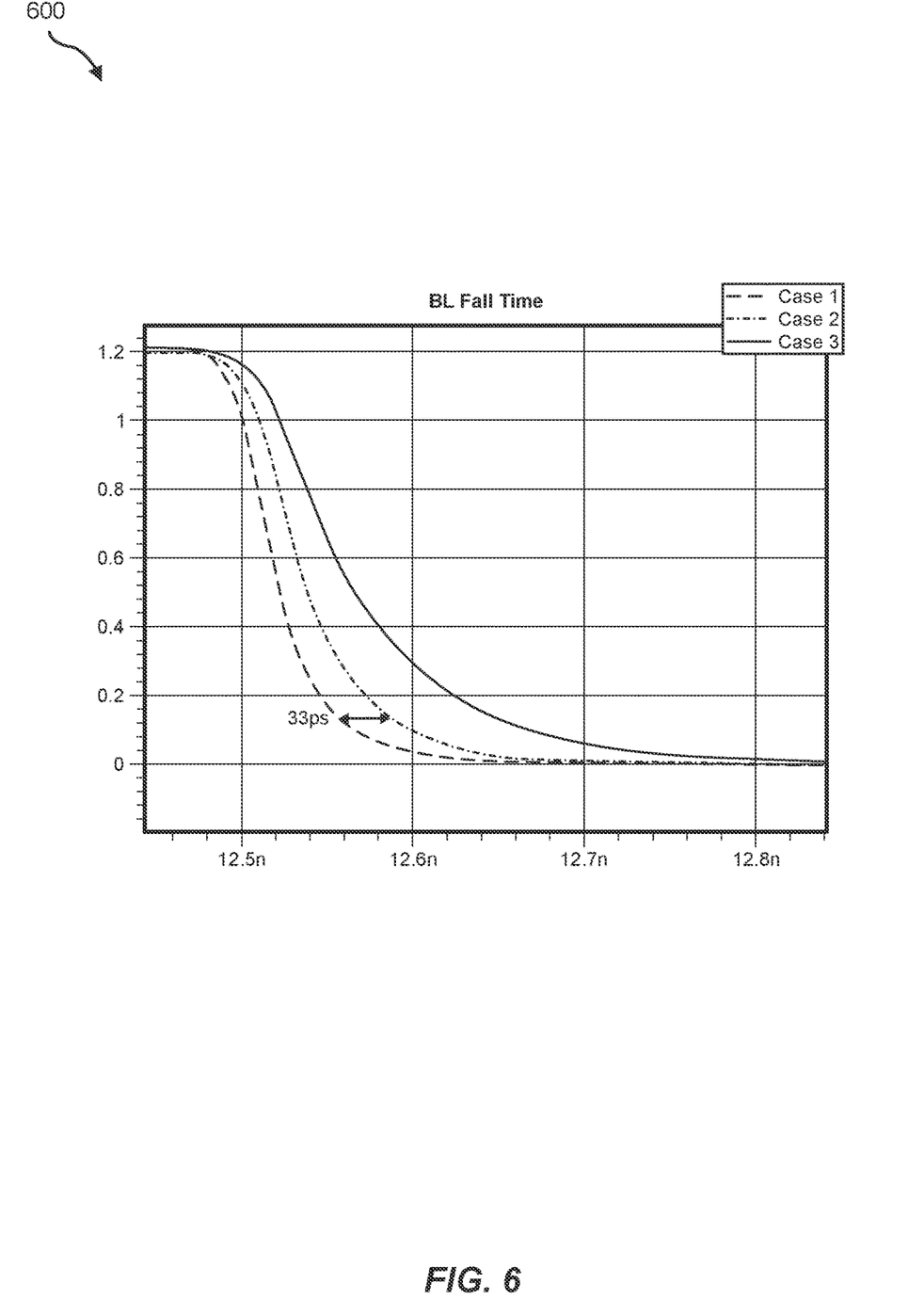
FIG. 6 is an illustration of bitline performance under differing conditions.

FIG. 6 shows a graph 600 of bitline performance under differing conditions. As shown in FIG. 6, in a case 3 (e.g., corresponding to device 306 of FIG. 3) may represent the slowest write operation of the three depicted cases. A case 2 (e.g., corresponding to device 304 of FIG. 3) may represent a faster write operation than case 3. A case 1 (e.g., corresponding to device 400 of FIG. 4, may represent the fastest write operation of the three depicted cases. Significantly, case 1 may also provide nearly twice the bit density of case 2.

Figure 7:
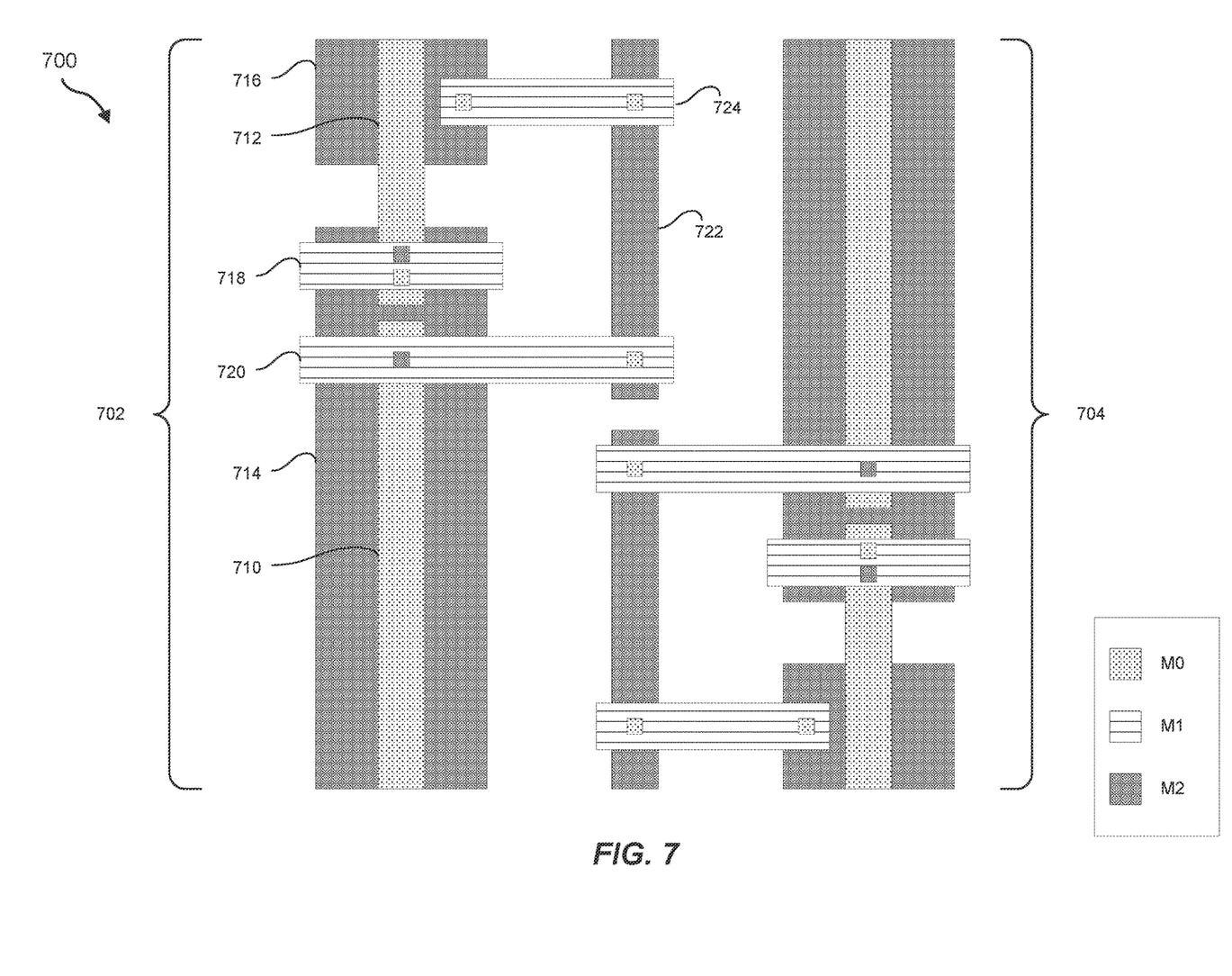
FIG. 7 is an illustration of an example jumper cell design.

FIG. 7 is an illustration of an example jumper cell device 700. As shown in FIG. 7, device 700 may include components on multiple metal levels (e.g., M0, M1, and M2). While M0, M1, and M2 are used by way of example, it may be appreciated that other combinations and/or arrangements of metal levels may be used. For example, in place of M1, device 700 may use M3.

Device 700 may include a bitline set 702 and a bitline set 704. For example, bitline set 702 may correspond to "true" bitlines, and bitline set 704 may correspond to corresponding complementary bitlines. Thus, it may be appreciated that bitline set 704 may have a parallel and/or symmetrical design to bitline set 702 (thus, for example, bitline set 704 is depicted as a version of bitline set 702 but rotated 180 degrees).

As shown in FIG. 7, device 700 may include a bitline 710 running on M0. In some examples, bitline 710 may correspond to bitline 430 of device 400 in FIG. 4 and/or the "first bitline" referred to herein. Device 700 may also include a bitline 712 running on M0. In some examples, bitline 710 may correspond to bitline 440 of device 400 in FIG. 4 and/or the "second bitline" referred to herein. Device 700 may also include a bitline 716 running on M2. In some examples, bitline 716 may correspond to bitline 434 of device 400 in FIG. 4 and/or the "third bitline" referred to herein. Device 700 may also include a bitline 714 running on M2. In some examples, bitline 714 may correspond to bitline 444 of device 400 in FIG. 4 and/or the "fourth bitline" referred to herein.

In some examples, bitline 712 may connect to bitline 714 by way of a connection element 718. For example, one or more vias may connect bitline 712 to bitline 714, either directly and/or via a connection element 718 (e.g., on M1). As can be seen, the connection of bitlines 712 and 714 may not require any deviation from the alignment of bitlines 712 and 714. In contrast, bitline 710 may connect to bitline 716 by way of a series of connection elements (e.g., connection element 720, connection element 722, and connection element 724) that form a connection path that may deviate from the line along which bitlines 710, 712, 714, and 716 run.

The architecture of jumper cell device 700 may allow the two composite bitlines (bitline 712 together with bitline 714, and bitline 710 together with bitline 716) to both extend in both directions (e.g., to write drivers at either end of the bitcell array). This may enable faster and/or more reliable write operations with a dense memory circuit configuration.

Figure 8:
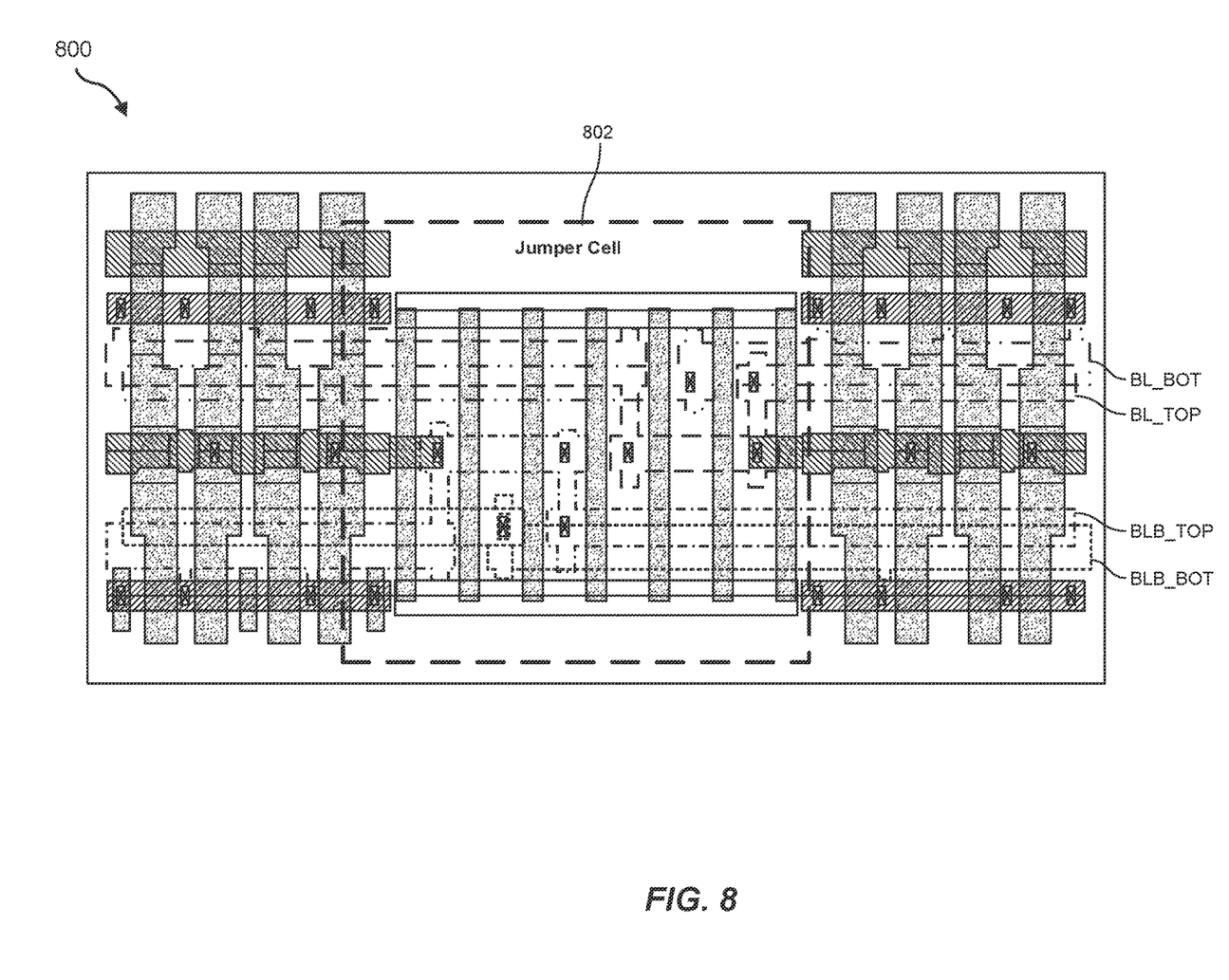
FIG. 8 is an additional illustration of an example jumper cell design.

FIG. 8 is an illustration of an example memory device 800 with a jumper cell 802. As shown in FIG. 8, jumper cell 802 may have a similar structure to that depicted by device 700 in FIG. 7, and may enable BL_TOP (e.g., a bitline for a top half of a bitcell array) and BL_BOT (e.g., a bitline for a bottom half of the same bitcell array), extend in both directions (to the left and to the right, as depicted in FIG. 8), while occupying the same area over two metal levels. Equivalent features apply to the complementary bitlines BLB_TOP and BLB_BOT.

Figure 9:
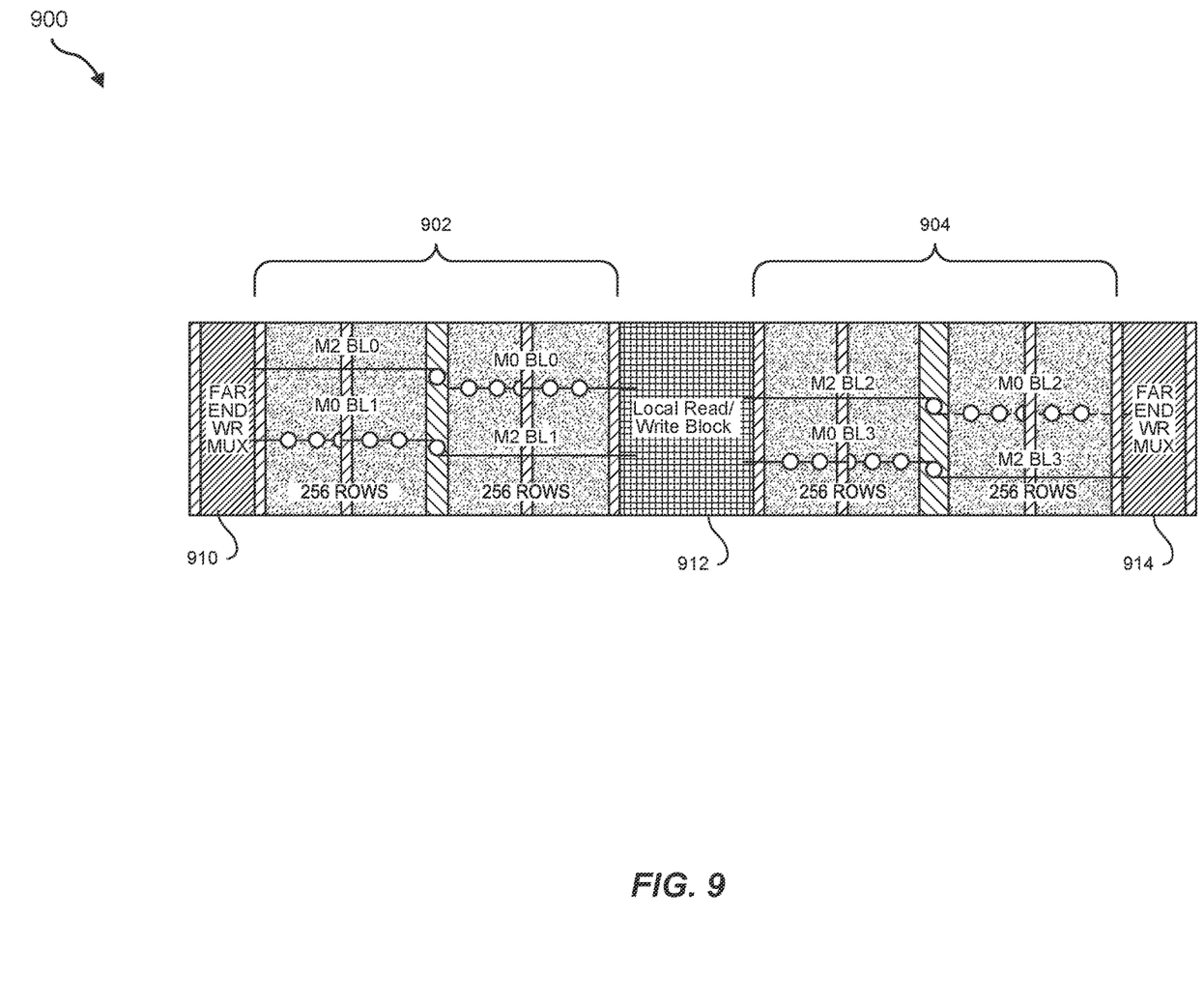
FIG. 9 is a diagram of an example floorplan for a memory array.

FIG. 9 is an example floorplan for a memory array 900. As shown in FIG. 9, memory array 900 may include a bank 902 and a bank 904. In one example, banks 902 and 904 may each correspond to device 700. In bank 902, a bitline BL0 may connect to a read/write multiplexer circuit 910 on one end (at M2) and a local read/write block 912 on the other end (at M0). Similarly, a bitline BL1 may connect to read/write multiplexer circuit 910 on one end (at M0) and local read/write block 912 on the other end (at M2). Likewise, in bank 904, a bitline BL2 may connect to a read/write multiplexer circuit 914 on one end (at M0) and local read/write block 912 on the other end (at M2). Similarly, a bitline BL3 may connect to read/write multiplexer circuit 910 on one end (at M2) and local read/write block 912 on the other end (at M0). While FIG. 9 shows four sets of 256 rows, systems and devices described herein (such as memory array 900) may include any suitable number of rows per set and may include any suitable number of sets of rows. For example, the overall number of rows (e.g., owing to the number of rows per set and/or to the number of sets) may be greater than 1,024. In addition, while FIG. 9 shows arrays of equal sizes, in some examples the sizes of the arrays shown in FIG. 9 may vary. For example, the sizes of the arrays proximate to local read/write block 912 may be larger or smaller than the sizes of the arrays further from local read/write block 912.

Figure 10:
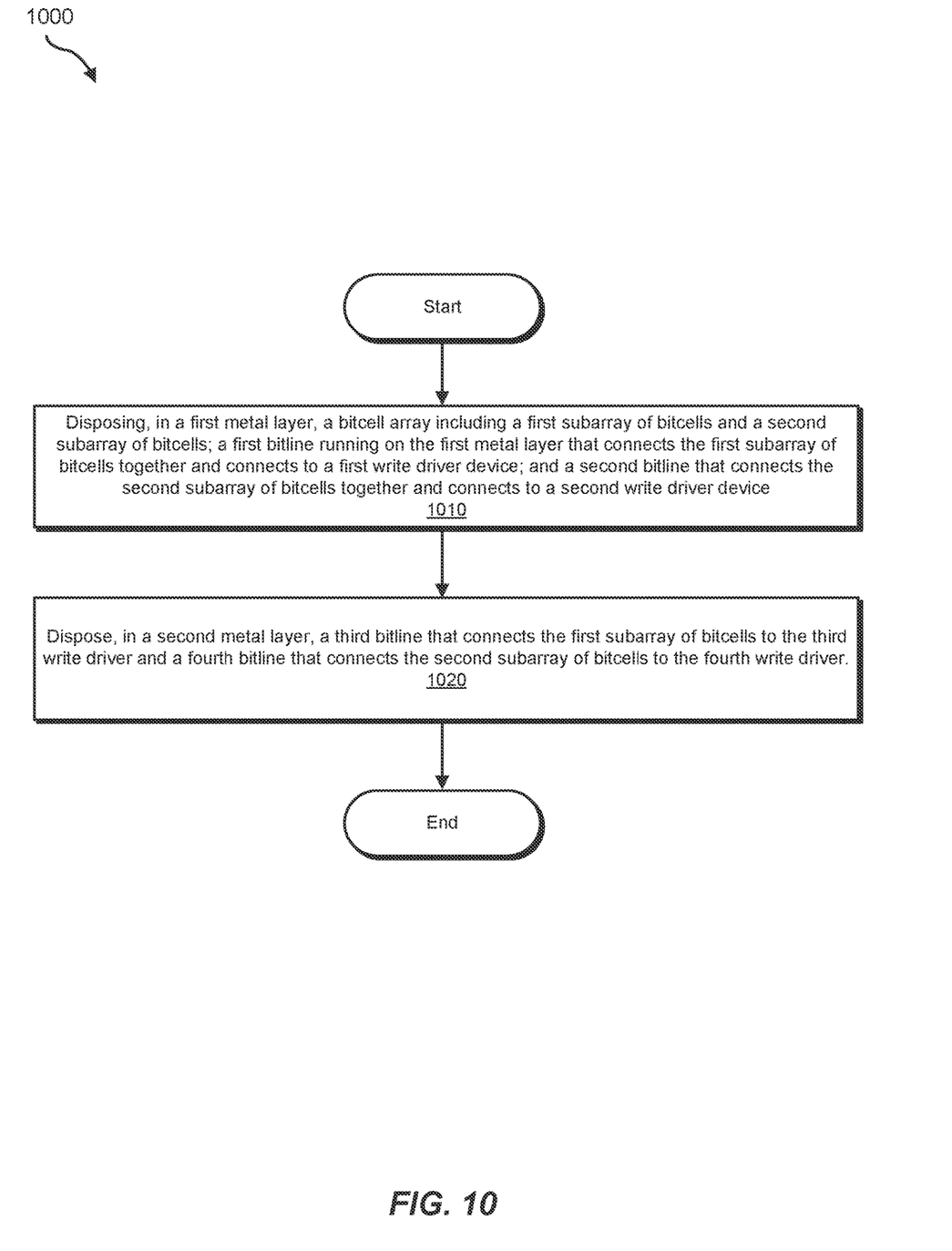
FIG. 10 is a flow diagram of an example method of manufacture for an example flying bitline with jumper cell.

FIG. 10 is a flow diagram of an example method 1000 of manufacture for a device with a flying bitline and jumper cell. As shown in FIG. 10, at step 1010 method 1000 may include disposing, in a first metal layer, a bitcell array including a first subarray of bitcells and a second subarray of bitcells. Step 1010 may also include disposing in the first metal layer a first bitline running on the first metal layer that connects the first subarray of bitcells together and connects to a first write driver device. Step 1010 may further include disposing in the first metal layer a second bitline that connects the second subarray of bitcells together and connects to a second write driver device.

At step 1020, method 1000 may include disposing, in a second metal layer, a third bitline that connects the first subarray of bitcells to the third write driver and a fourth bitline that connects the second subarray of bitcells to the fourth write driver.

In some examples, a method of manufacture that includes steps 1010 and 1020 may also include disposing a jumper cell between the first subarray of bitcells and the second subarray of bitcells, such that the first bitline and the third bitline are connected by the jumper cell and the second bitline and the fourth bitline are connected by the jumper cell.

In further examples, a method of manufacture may include manufacturing a jumper cell by connecting a first bitline and a third bitline by a via running from the first metal layer to the second metal layer. The method of manufacturing the jumper cell may also include connecting a second bitline to a fourth bitline by a series of connectors that are connected by vias running between metal layers and that run out of line with the first, second, third, and fourth bitlines by running laterally away from the second bitline, running in the direction of the first, second, third, and fourth bitlines, and then running laterally toward the fourth bitline.

The process parameters and sequence of steps described and/or illustrated herein are given by way of example only and can be varied as desired. For example, while the steps illustrated and/or described herein can be shown or discussed in a particular order, these steps do not necessarily need to be performed in the order illustrated or discussed. The various example methods described and/or illustrated herein can also omit one or more of the steps described or illustrated herein or include additional steps in addition to those disclosed.

The preceding description has been provided to enable others skilled in the art to best utilize various aspects of the example implementations disclosed herein. This example description is not intended to be exhaustive or to be limited to any precise form disclosed. Many modifications and variations are possible without departing from the spirit and scope of the present disclosure. The implementations disclosed herein should be considered in all respects illustrative and not restrictive. Reference should be made to the appended claims and their equivalents in determining the scope of the present disclosure.

Unless otherwise noted, the terms "connected to" and "coupled to" (and their derivatives), as used in the specification and claims, are to be construed as permitting both direct and indirect (i.e., via other elements or components) connection. In addition, the terms "a" or "an," as used in the specification and claims, are to be construed as meaning "at least one of." Finally, for ease of use, the terms "including" and "having" (and their derivatives), as used in the specification and claims, are interchangeable with and have the same meaning as the word "comprising."

What is claimed is:

1. A device comprising:
   a bitcell array located on a first metal layer comprising:

a first subarray of bitcells; and
a second subarray of bitcells;
at least one jumper cell, wherein the first subarray of bitcells and the second subarray of bitcells are disposed on opposite sides of the at least one jumper cell;
a first write driver device coupled, via the at least one jumper cell, to the first subarray of bitcells from a first end of the first subarray;
a second write driver device coupled, via the at least one jumper cell, to the second subarray of bitcells from a first end of the second subarray;
a third write driver device coupled, via the at least one jumper cell, to the first subarray of bitcells from a second end of the first subarray; and
a fourth write driver device coupled, via the at least one jumper cell, to the second subarray of bitcells from the second end of the second subarray.

2. The device of claim 1, wherein the second end of the first subarray and the second end of the second subarray are proximate ends and the first end of the first subarray and the first end of the second subarray are distal ends.

3. The device of claim 1, further comprising:
a first bitline running on the first metal layer that connects the first subarray of bitcells together and connects to the first write driver device;
a second bitline running on the first metal layer that connects the second subarray of bitcells together and connects to the second write driver device;
a third bitline running on a second metal layer that connects first subarray of bitcells to the third write driver device; and
a fourth bitline running on the second metal layer that connects the second subarray of bitcells to the fourth write driver device.

4. The device of claim 3, wherein:
the first and second write driver devices are located on the first metal layer; and
the third and fourth write driver devices are located on the second metal layer.

5. The device of claim 3, wherein:
the first bitline connects to the third bitline via the at least one jumper cell; and
the second bitline connects to the fourth bitline via the at least one jumper cell.

6. The device of claim 5, wherein the jumper cell comprises:
a first via connecting the first bitline to the third bitline;
a second via connecting the second bitline to a connection path that runs at least in part on a third metal layer; and
a third via connecting the connection path to the fourth bitline.

7. The device of claim 3, wherein:
the first bitline is vertically aligned over the fourth bitline; and
the second bitline is vertically aligned over the third bitline.

8. The device of claim 3, further comprising:
a first precharge device that precharges the first bitline;
a second precharge device that precharges the second bitline;
a third precharge device that precharges the third bitline; and
a fourth precharge device that precharges the fourth bitline.

9. The device of claim 3, further comprising a set of complementary bitlines arranged in parallel with the first, second, third, and fourth bitlines.

10. The device of claim 1, wherein the first and second subarrays are substantially in line.

11. A system comprising:
a memory circuit comprising:
a series of bitcell arrays, the series of bitcell arrays comprising a bitcell array located on a first metal layer comprising:
a first subarray of bitcells; and
a second subarray of bitcells;
at least one jumper cell, wherein the first subarray of bitcells and the second subarray of bitcells are disposed on opposite sides of the at least one jumper cell;
a first write driver device coupled, via the at least one jumper cell, to the first subarray of bitcells from a first end of the first subarray;
a second write driver device coupled, via the at least one jumper cell, to the second subarray of bitcells from a first end of the second subarray;
a third write driver device coupled, via the at least one jumper cell, to the first subarray of bitcells from a second end of the first subarray; and
a fourth write driver device coupled, via the at least one jumper cell, to the second subarray of bitcells from the second end of the second subarray; and
a processing device that is communicatively coupled to the memory circuit and that is configured to:
store data in the memory circuit; and
process data retrieved from the memory circuit.

12. The system of claim 11, wherein the second end of the first subarray and the second end of the second subarray are proximate ends and the first end of the first subarray and the first end of the second subarray are distal ends.

13. The system of claim 11, further comprising:
a first bitline running on the first metal layer that connects the first subarray of bitcells together and connects to the first write driver device;
a second bitline running on the first metal layer that connects the second subarray of bitcells together and connects to the second write driver device;
a third bitline running on a second metal layer that connects first subarray of bitcells to the third write driver device; and
a fourth bitline running on the second metal layer that connects the second subarray of bitcells to the fourth write driver device.

14. The system of claim 13, wherein:
the first and second write driver devices are located on the first metal layer; and
the third and fourth write driver devices are located on the second metal layer.

15. The system of claim 13, wherein:
the first bitline connects to the third bitline via the at least one jumper cell; and
the second bitline connects to the fourth bitline via the at least one jumper cell.

16. The system of claim 15, wherein the jumper cell comprises:
a first via connecting the first bitline to the third bitline;
a second via connecting the second bitline to a connection path that runs at least in part on a third metal layer; and
a third via connecting the connection path to the fourth bitline.

17. The system of claim 13, wherein:
the first bitline is vertically aligned over the fourth bitline; and the second bitline is vertically aligned over the third bitline.

18. The system of claim 13, further comprising:
a first precharge device that precharges the first bitline;
a second precharge device that precharges the second bitline;
a third precharge device that precharges the third bitline; and
a fourth precharge device that precharges the fourth bitline.

19. The system of claim 13, further comprising a set of complementary bitlines arranged in parallel with the first, second, third, and fourth bitlines.

20. A method of manufacture comprising:
disposing, in a first metal layer:
   a bitcell array comprising:
     a first subarray of bitcells; and
     a second subarray of bitcells;
   at least one jumper cell, wherein the first subarray of bitcells and the second subarray of bitcells are disposed on opposite sides of the at least one jumper cell;
   a first bitline that connects, via the at least one jumper cell, the first subarray of bitcells together and connects to a first write driver device; and
   a second bitline that connects, via the at least one jumper cell, the second subarray of bitcells together and connects to a second write driver device; and
disposing, in a second metal layer:
   a third bitline that connects, via the at least one jumper cell, first subarray of bitcells to the third write driver device; and
   a fourth bitline that connects, via the at least one jumper cell, the second subarray of bitcells to the fourth write driver device.

\* \* \* \* \*